United States Patent
Gorrell (10) Patent No.: US 6,707,351 B2
(45) Date of Patent: Mar. 16, 2004

(54) TUNABLE MEMS RESONATOR AND METHOD FOR TUNING

(75) Inventor: Jonathan F. Gorrell, Gainsville, FL (US)

(73) Assignee: Motorola, Inc., Schaumburg, IL (US)

( * ) Notice: Subject to any disclaimer, the term of this patent is extended or adjusted under 35 U.S.C. 154(b) by 31 days.

(21) Appl. No.: 10/107,697

(22) Filed: Mar. 27, 2002

(65) Prior Publication Data

US 2003/0184412 A1 Oct. 2, 2003

(51) Int. Cl.[7] .......................... H03H 9/46; H03H 3/013; H03H 9/24
(52) U.S. Cl. ...................... 333/188; 333/186; 333/197; 333/200; 257/414; 310/312
(58) Field of Search ................................ 333/186–192, 333/197, 200; 257/414; 310/312

(56) References Cited

U.S. PATENT DOCUMENTS

| | | | | |
|---|---|---|---|---|
| 3,614,678 A | * | 10/1971 | Engeler | 333/187 |
| 4,443,728 A | * | 4/1984 | Kudo | 310/312 |
| 4,447,753 A | * | 5/1984 | Ochiai | 310/312 |
| 4,676,993 A | * | 6/1987 | Roberts et al. | 427/10 |
| 5,274,297 A | * | 12/1993 | Hermann et al. | 310/361 |
| 5,455,547 A | * | 10/1995 | Lin et al. | 333/186 |
| 5,587,620 A | * | 12/1996 | Ruby et al. | 310/346 |
| 6,118,164 A | * | 9/2000 | Seefeldt et al. | 257/417 |
| 6,249,073 B1 | * | 6/2001 | Nguyen et al. | 310/309 |

OTHER PUBLICATIONS

D. Joachim et al.; "Selective Polysilicon Deposition for Frequency Tuning of MEMS Resonators"; *Fifteenth IEEE International Conference on Micro Electro Mechanical Systems*, Jan. 20–24, 2002, pp. 727–730.*

A.S. Holmes et al.; "Multilayer Electroformed Devices on Silicon Substrates" *IEE Seminar on Demonstrated Micromachining Technologies for Industry* Mar., 2000, pp. 5/1–5/4.*

* cited by examiner

*Primary Examiner*—Barbara Summons (57) ABSTRACT

MEMS resonators (100, 400, 500) include a source of material that is capable of sublimation (128, 130, 406, 408, 502, 504). Conductive pathways (132, 134, 402, 404, 502, 504) to the material are used to supply current of ohmically heat the material in order to cause the material to sublimate. The material may be located either on or in close proximity to a resonant member (114) of the resonator. By sublimating the material, the mass of the resonant member is either increased or decreased thereby altering the resonant frequency of the resonant member. The resonant member is preferably located in a recess that is capped by a cap (202) forming a vacuum enclosure, and the material capable of sublimation preferably comprises a material that serves to getter any residual gases in the vacuum enclosure.

19 Claims, 6 Drawing Sheets

TUNABLE MEMS RESONATOR AND METHOD FOR TUNING

FIELD OF THE INVENTION

The present invention relates to microelectromechanical Systems (MEMS). More particularly, the present invention pertains to frequency selective MEMS devices.

BACKGROUND OF THE INVENTION

Currently, there is an interest in increasing the degree of integration of electronics. Integration has proceeded steadily over the last few decades and achieved remarkable reduction in the physical size occupied by electronic circuits. Semiconductor lithography has enabled circuits with millions of transistors to be constructed on a single silicon die. Nonetheless, certain components are difficult to integrate.

One important component that is used to generate stable frequencies in a variety of electronic apparatus including sequential logic (e.g., microprocessors) and wireless communication transceivers is the quartz crystal resonator. The quartz crystal resonator in its usual form is a bulky discrete component.

Microelectromechanical System (MEMS) based resonators have been proposed as alternatives to quartz resonators for use as frequency selective components at RF frequencies. One type of MEMS resonator that has been proposed comprises a suspended beam of semiconductor material that is shaped and sized to resonate at a selected frequency chosen in view of a desired electrical frequency response. The MEMS resonator serves as a frequency selective component in a circuit. According to one design the MEMS resonator is driven by a drive electrode that extends below the suspended beam. Electric force interaction between the suspended beam and the drive electrode induces the suspended beam to vibrate. Similar structures may be used as frequency selective filters. In such a use an input signal applied to a first terminal is used to drive the mechanical structure of the resonator into resonance, and an output signal is coupled out of a second terminal. In as much as only that part of the signal is near the resonant frequency of the resonator, only a narrow frequency band of the applied signal is coupled to the second terminal.

During the past decade there has been an increased interest in the semiconductor industry in the use of Silicon-On-Insulator (SOI) wafers. SOI wafers include a silicon substrate, a silicon di-oxide layer on the silicon substrate, and a single crystal silicon layer on the silicon di-oxide layer. SOI wafers afford a number of advantages in terms of the electrical properties of circuits built using them, including reduced voltage requirements, and power consumption for a given clock speed.

In a previously filed patent application entitled "MEMS RESONATORS AND METHODS FOR MANUFACTURING MEMS RESONATORS" Ser. No. 09/828,431 (Application pursuant to Motorola disclosure numbers: CM03351J, CM03352J, CM03524J) filed on Apr. 9, 2001 and assigned to the assignee of the present invention, a type of MEMS resonators that is fabricated on SOI wafers is disclosed.

In the disclosed SOI MEMS resonators, a flexural mode resonant beam and a number of support beams that attach to the flexural mode resonant beam at node points are etched from the top single crystal silicon layer of the SOI wafer. A portion of the silicon di-oxide layer in an area underneath the flexural mode resonant beam, and the support beams is removed by an isotropic etch to allow for free movement of the flexural mode resonant beam and the support beams. For the disclosed types of MEMS resonators, at least some of the fabrication steps required to fabricate the resonator, may be accomplished by processing operations (e.g., resist exposure, doping, etching) that are also conducted for the purpose of fabricating electrical circuits on the die on which the MEMS resonators are fabricated. Thus, the disclosed MEMS resonators may be integrated with electronic circuits very efficiently.

The frequency of resonators used in electrical circuits such as oscillators is often specified at a precision of tens of parts per million. For filtering applications even higher degrees of accuracy are desired. On the other hand the dimensional tolerances that are achieved semiconductor lithography and etch processes are often on the order of plus or minus 5% percent. Dimensional variations of resonators fabricated using semiconductor lithography may, consequently, suffer wide variations in resonant frequency.

DETAILED DESCRIPTION OF THE PREFERRED EMBODIMENTS

Figure 1:
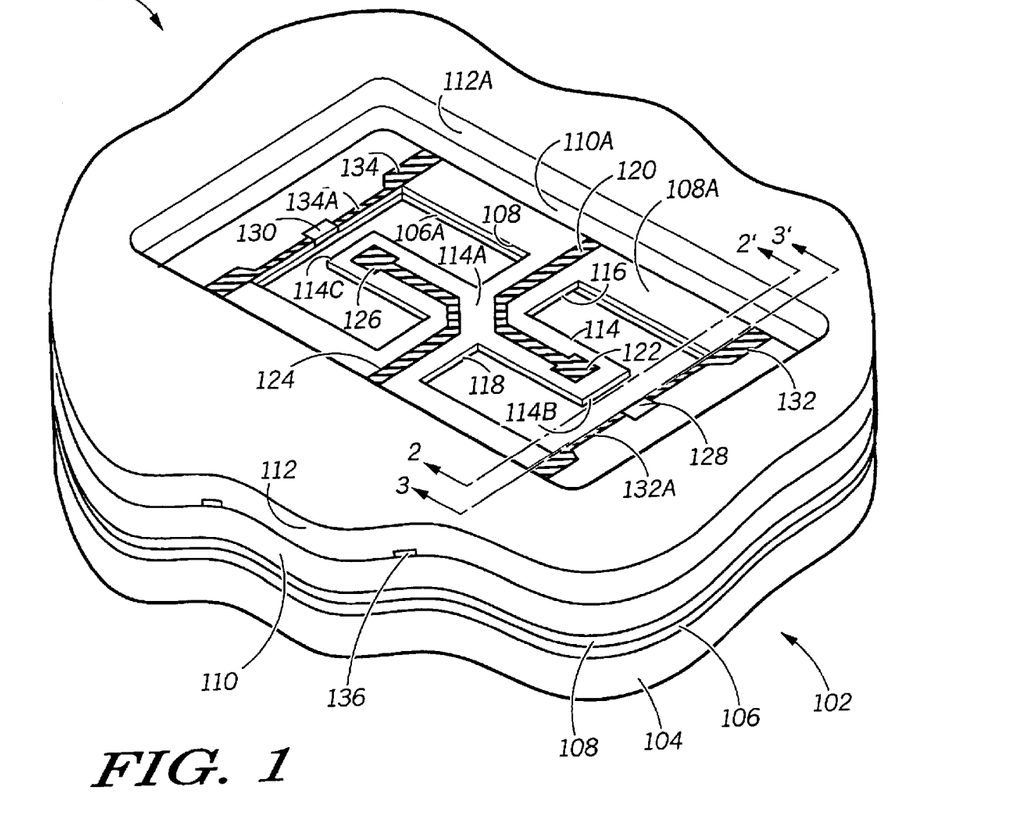
FIG. 1 is a fragmentary perspective view of a die including a MEMS resonator according to a first embodiment of the invention.
Figure 2:
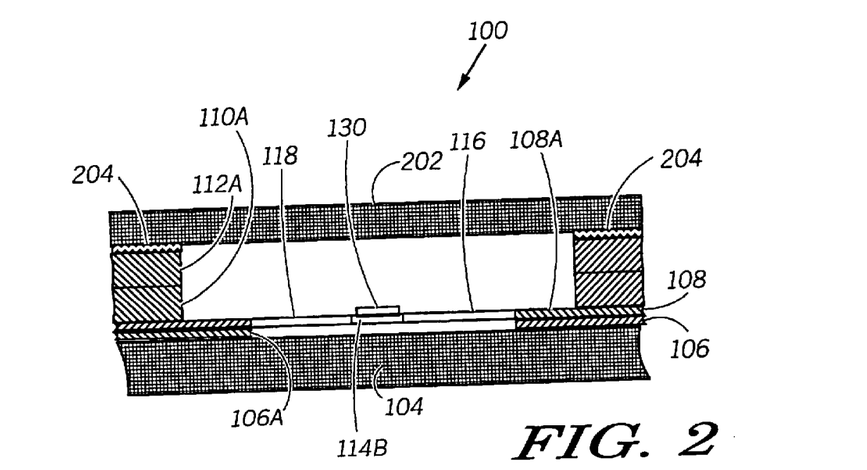
FIG. 2 is a first fragmentary elevation view of the die including the MEMS resonator shown in FIG. 1.
Figure 3:
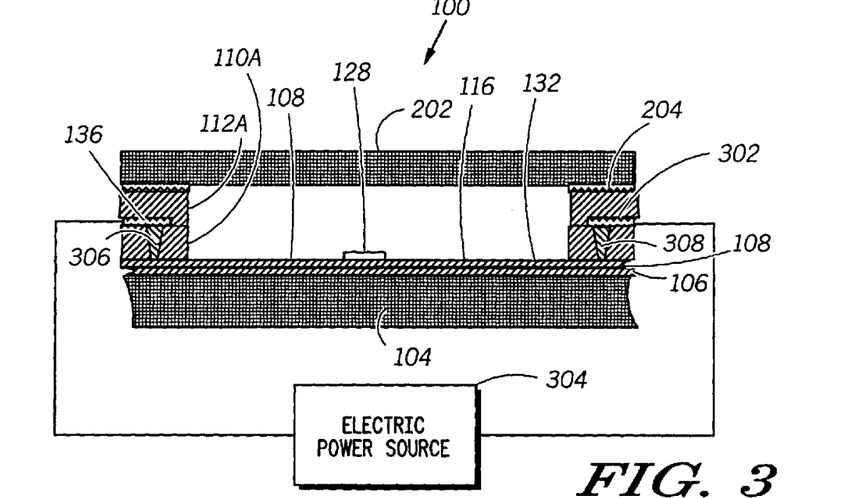
FIG. 3 is a second fragmentary elevation view of the die including the MEMS resonator shown in FIG. 1.

Referring to FIGS. 1–3 a MEMS resonator 100 according to a first embodiment of the invention is shown. The MEMS resonator 100 is fabricated at the surface of a SOI die, 102. The SOI die initially includes a massive semiconductor base layer 104, a oxide layer 106 on top of the semiconductor base layer 104, and a thin semiconductor layer 108 on top of the oxide layer 106. The semiconductor base layer 104 preferably comprises a monocrystalline silicon wafer, the oxide layer 106 preferably comprise $SiO_2$, and the thin semiconductor layer 108 preferably comprises monocrystalline silicon, but may alternatively comprises a compound semiconductor material such as GaAs.

Various additional layers, as will be described are deposited on the SOI die 102, in order to fabricated the MEMS resonator 100 according to the first embodiment of the invention. The additional layers include a first insulator layer 110, and a second insulator layer 112 deposited on the first insulator layer 110. A patterned metallization layer that includes traces described below, is located between the first 110 and second 112 insulator layers.

A microelectromechanical resonant structure that includes a main beam 114 that is characterized by a mass and two support beams 116, 118 is etched out of the thin semiconductor layer 108. The two support beams 116, 118 attach to opposite sides of the main beam at a longitudinal center 114A of the main beam 114. The two support beams 116, 118 are perpendicular to the main beam 114. The two support beams 116, 118 serve as torsional hinges allowing the main beam 114 to oscillate rotationally through an angular range about an axis that extends parallel to the two support beams 116, 118. The main beam 114, may also vibrate in a flexural beam mode. In the latter case the longitudinal center 114A of the main beam, at which the support beams 116, 118 attach is coincident with a nodal line of the flexural beam mode. An oblong portion of the oxide layer 106 underlying the main beam 114, and the support beams is removed (e.g., by chemical etching) so as to allow the main beam to rotate and or flex, and allowing the support beams 116, 118 to twist. The oxide layer 106 extends toward the area of the beams 114, 116, 118 up to an inner oxide layer edge 106A.

A first conductive pathway 120 extends from a peripheral portion 108A of the thin semiconductor layer 108 over the first support beam 116 to the main beam 114, and to a first electrode area 122 near a first end 114B of the main beam 114. Similarly a second conductive pathway 124 extends from the peripheral portion 108A of the thin semiconductor layer 108 over the second support beam 118 to the main beam 114, and to a second electrode area 126 near a second end 114C of the main beam 114. The conductive pathways 120, 124 and the electrode areas 122, 126 are preferably formed by patternwise doping the thin semiconductor layer 108. The conductive pathways 120, 124 may be used to apply a bias voltage and a drive signal to one or both of the electrode areas 122, 126. The drive signal establish periodic electric forces between the main beam 114 and the semiconductor base 104 that serve to drive the main beam 114 to vibrate rotationally and/or in a flexural beam mode. The current flowing into the conductive pathways will have an AC component, the magnitude of which will depend strongly on frequency relative to a frequency vibration of the resonator 100. Thus, the resonator 100 may be employed in an oscillator circuit to establish a frequency of oscillator, in a manner analogous to how quartz resonators are used in oscillator circuits.

In the case of using the resonator 100 as a filter an input signal may be applied to the first conductive pathway 120 and filtered output detected on the second conductive pathway 124.

The frequency of vibration of the main beam 114 vibrating in a rotary or flexural mode depends on the dimensions of the main beam 114, and of the support beam 116, 118. In as much as these dimensions are established by a semiconductor fabrication etching process, (e.g., reactive ion etching, wet chemical etching), the tolerance of these dimensions is not to be neglected. Typically the tolerance of semiconductor fabrication etching process is on the order of +/−5 percent. The tolerance of semiconductor fabrication etching process leads to variations in the frequency of vibration of the resonator 100, that may exceed what is desired for certain applications (e.g., for use in oscillators used in communication equipment).

According to the first embodiment of the invention the problem of dimensional variations leading to frequency variations is remedied by providing first and second patches of vaporizable material 128, 130 on the peripheral portion 108A of the thin semiconductor layer 108, and by providing third and fourth conductive pathways 132, 134 for heating the first and second patches 128, 130. The first patch of vaporizable material 128 is located proximate the first end 114B of the main beam, and the second patch of vaporizable material 130 is located proximate the second end 114C of the main beam 114. The aforementioned locations foster the deposition of material vaporized from the patches 128, 130 onto the ends 114B, 114C of the main beam. The patches of vaporizable material 128, 130 preferably comprise a metal that sublimates when heated, and more preferably comprise Titanium. Titanium has the additional advantageous property of gettering residual gas in vacuum enclosures. The latter advantage is discussed more fully below.

The third and fourth conductive pathways 132, 134 included narrow middle segments 132A, 134A that pass under the patches of vaporizable material 128, 130. The narrow middle segments 132A, 134A have increased resistance resulting in increased ohmic heating of the patches 128, 130 when a current is passed through the third and fourth conductive pathways 132, 134. The third and fourth conductive pathways 132, 134 are preferably formed by pattern wise doping of the thin semiconductor layer 108 (e.g., in the same operation used to form the first and second 120, 124 conductive pathways). In the preferable case that the third and fourth conductive pathways are formed by patternwise doping, their length is preferably kept to a minimum so as to reduce resistive loss in areas of the die 102 remote from the patches of vaporizable material 128, 130. Metallization lines as described below may be used to coupled current to and from the third and fourth conductive pathways 132, 134.

As shown in FIGS. 1–3 an oblong opening is formed in the first and second insulator layers 110, 112, surround the patches of vaporizable material 128, 130 and the moving parts i.e., beams 114, 116, 118 of the resonator 100. The oblong opening is bound by an inner peripheral edge 110A of the first insulator layer 110, and a congruent inner peripheral edge 112A of the second insulator layer 112.

As shown in FIGS. 2–3 (not shown in FIG. 1) a cap 202 is affixed over the oblong opening formed in the first and second insulator layers 110, 112, forming a vacuum enclosure. The cap 202 is preferably a non porous material (e.g., semiconductor, ceramic). A glass frit material 204 is used to bond the cap 202 to the second insulator layer 112. Bonding is preferably performed under vacuum in order that the recess will be substantially devoid of entrapped air and consequently the quality factor Q of the resonator 100 will be improved. The presence of Titanium patches 128, 130 assists in gettering residual gas from the oblong opening, after the cover 202 has been affixed. Heating of titanium patches 128, 130 enhances the gettering action.

A first conductive trace 136 and a second conductive trace 302 are formed between the first and second insulator layers 110, 112. The two conductive traces 136, 302 are used to supply (current) from an electric power source 304 to the third conductive pathways 132. The first and second conductive traces 136, 302 are connected to the third conductive pathway 132 by first and second plugs 306, 308 respectively. The plugs 306, 308 extend from the conductive traces 136, 302, through the first insulator layer to the third conductive pathway 132. Portions of the conductive pathway 132 that contact the plugs 306, 308 are preferably degeneratively doped so that good ohmic contact may be established. Like arrangements of plugs and metallization traces (not shown) are used to supply power to the fourth conductive pathway 134, and couple signals to and/or from the first 120, and second 124 conductive pathways. Additional vias (not shown) may be formed through the second insulation layer 112 to connect the first and conductive traces 136, 302 to external connection electrical contact pads (not shown). Such additional vias may be located on the die remote from the position of the resonator 100.

In order to tune the resonator 100 the frequency of a signal(s) applied to one of the first and second conductive pathways 120, 124 is swept up and down over a range that includes the range (due to lithography process tolerances) of pretuned resonant frequencies of the resonator 100. At the same time the current from the other of the first and second conductive pathways 120 124 is monitored to detect a resonant frequency of the resonator 100. Simultaneously a current is applied to one or both of the third and fourth conductive pathways 132, 134 in order to slowly sublimate one or both of the patches 128, 130. As material from the patches 128, 130 sublimates some of it deposits on the main beam 114 adding mass to the main beam 114 and lowering the resonant frequency of the resonator 100. When the resonant frequency of the resonator 100 reaches a desired frequency, the current to the third and/or fourth conductive pathways 132 134 is cut so as stop further evaporation of the patches 128, 132. During the tuning operation sublimation of the patches 128, 130 also serves to getter any residual gases in the oblong opening. Thus each such resonator 100 may be efficiently tuned after fabrication.

Figure 4:
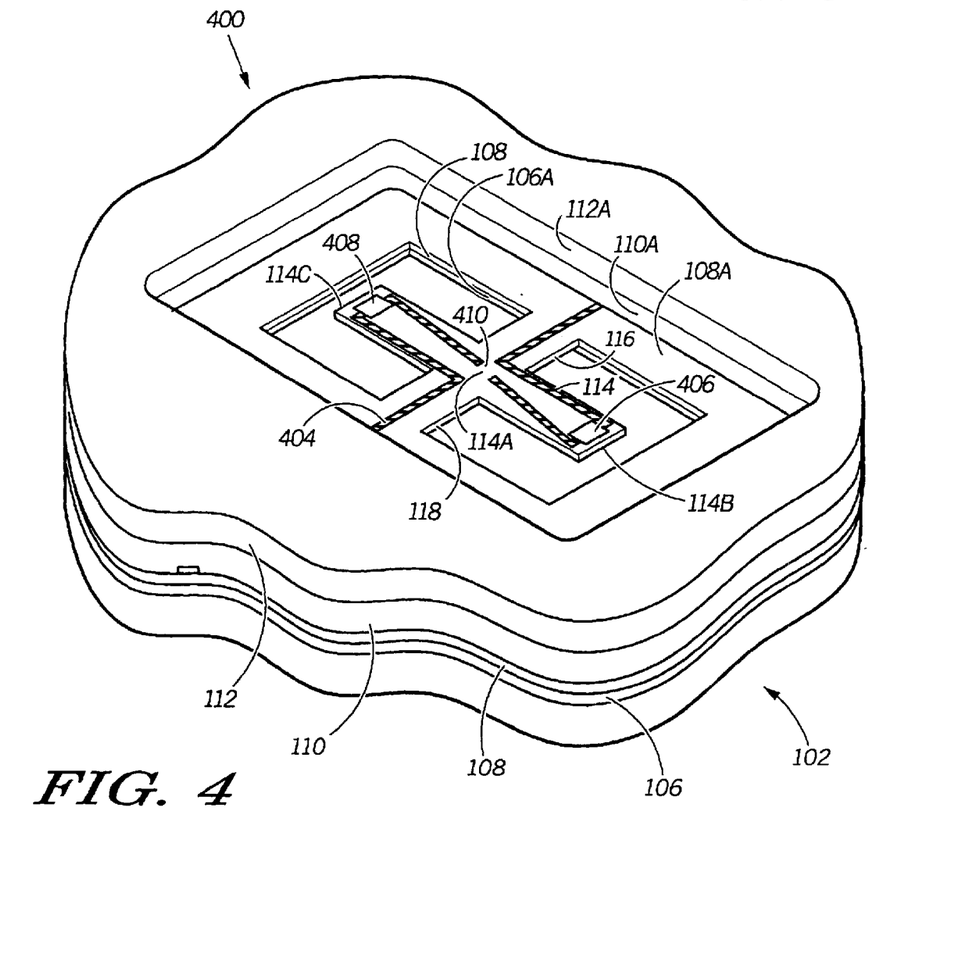
FIG. 4 is a fragmentary perspective view of a die including a MEMS resonator according to a second embodiment of the invention.

FIG. 4 is a fragmentary perspective view of the die 102 including a MEMS resonator 400 according to a second embodiment of the invention. Structural details shared with the MEMS resonator shown in FIGS. 1–3 are indicated by common reference details, and reference is made to the description above for a description of those details. In the second embodiment resonator 400 the first through fourth conductive pathways 120, 124, 132, 134 are not used. In lieu of them, a fifth conductive pathway 402, and a sixth conductive pathway 404 are provided. The fifth conductive extends from the peripheral portion 108A of the thin semiconductor layer 108 over the first support beam 116 to the main beam 114 to the first end 114A of the main beam 114, underneath a third patch of vaporizable material 406, and back to the center 114A of the main beam 114. Similarly, a six conductive pathway 404 extends from the peripheral portion 108A of the thin semiconductor layer 108 over the second support beam 118 to the main beam 114, to the second end 114B of the main 114, underneath a fourth patch of vaporizable material 408, and back to the center 114A of the main beam. The fifth and sixth conductive pathways 402, 404 preferably comprise opposite type dopants. Consequently a PN junction 410 is formed between ends of the fifth and sixth conductive pathways 402, 404 at the center 114A of the main beam 114.

In order to adjust the resonant frequency of the resonator 400 according to the second embodiment of the invention, an electrical potential is applied to the fifth and sixth conductive pathways 402, 404 in order to forward bias the PN junction 410. When the PN junction 410 is forward biased, current flows through the fifth and sixth conductive pathways 402, 404, ohmically heating the third and fourth patches of vaporizable material 406, 408, and causing material to sublime from the patches 406, 408 thereby reducing the mass of sublimable material borne on the main beam, 114 and increasing the resonant frequency of the resonator 400.

In order to use the resonator 400, the fifth and sixth conductive pathways 402, 404 are biased so that the PN junction 410 is reversed biased. Under the latter circumstances, a periodic signal component may be applied to one or both of the fifth and sixth conductive pathways 402, 404 in order to drive the resonator 400 into oscillation, and a current to one or both of the fifth and sixth conductive pathways 402, 404, may be sensed and used to establish the frequency of oscillation of an oscillator circuit (not shown).

The resonator 400 may be tuned by alternately forward biasing the PN junction 410 in order to evaporate material from the third and fourth patches 406, 408, and reversing biasing the PN junction 410 while simultaneously driving the resonator 400 with a swept frequency signal, and measuring the amplitude of a current into the resonator 400 in order to determine its resonant frequency. The foregoing procedure may be repeated until the resonator 400 resonates at a desired frequency.

Although not shown a thin insulating film may be provided between the patches of vaporizable material 406, 408 and the main beam.

Although not shown, alternatively the first and second patches 128, 130 and third and fourth conductive pathways 132, 134 may be added to the resonator shown in FIG. 2 to make a resonator in which mass may be either added to or removed from the main beam 114.

Figure 5:
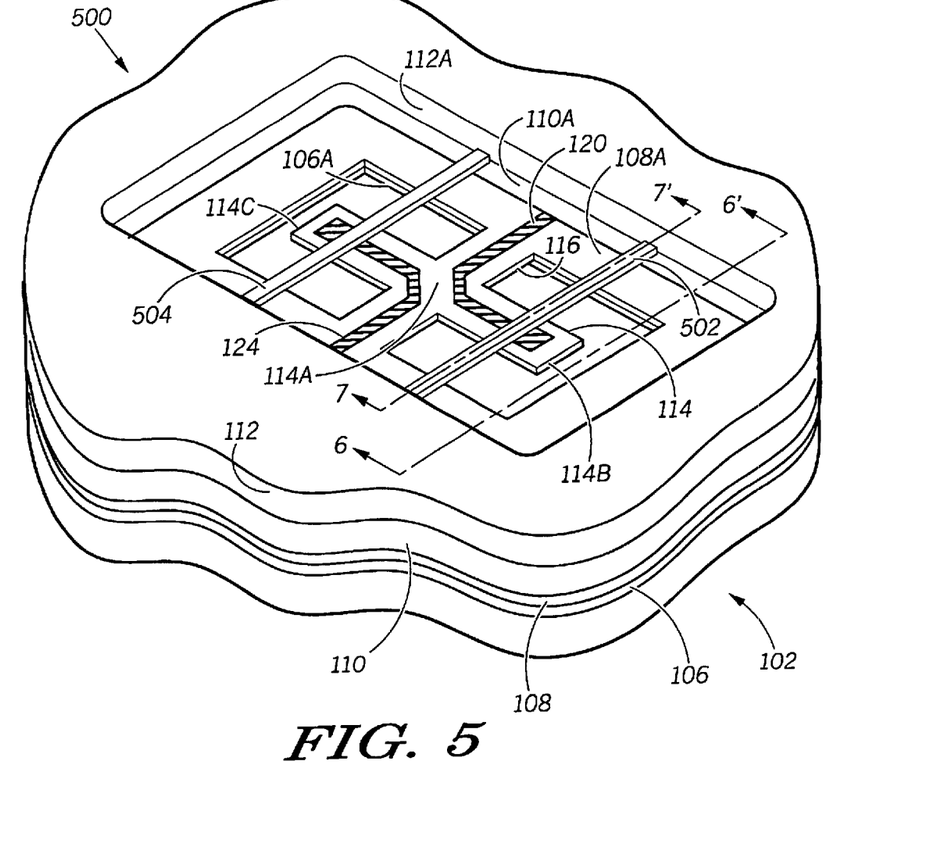
FIG. 5 is a fragmentary perspective view of a die including a MEMS resonator according to a third embodiment of the invention.
Figure 6:
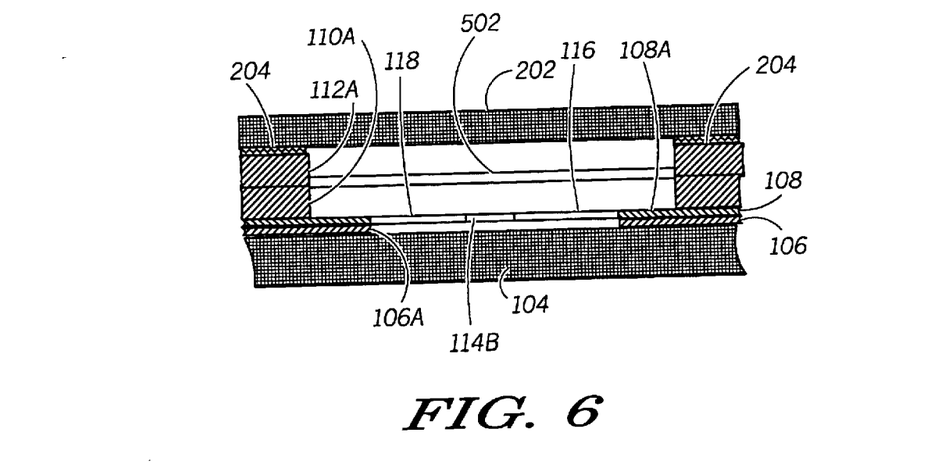
FIG. 6 is a first fragmentary elevation view of the die including the MEMS resonator shown in FIG. 5.
Figure 7:
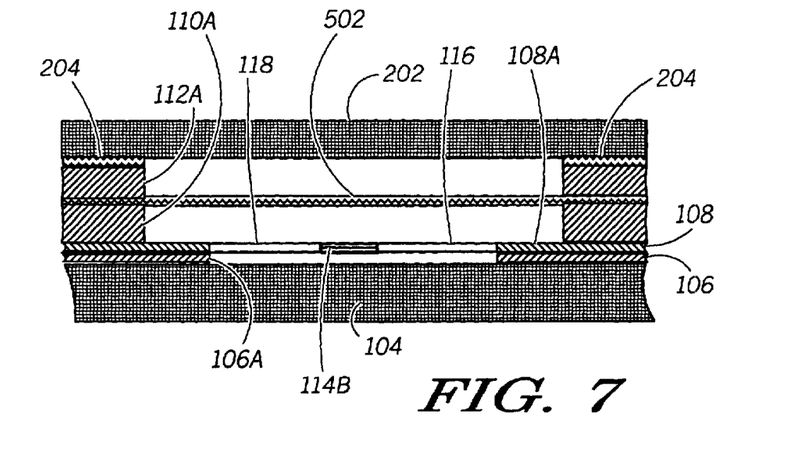
FIG. 7 is a second fragmentary elevation view of the die including the MEMS resonator shown in FIG. 5.

Referring to FIGS. 5–7 a MEMS resonator 500 according to a third embodiment of the invention is shown. Structural details shared with the MEMS resonator shown in FIGS. 1–3 are indicated by common reference details, and reference is made to the description above for a description of those details. The MEMS resonator 500 according to the third embodiment of the invention, includes the first and second conductive pathways 120, 124, but does not include third and forth conductive pathways 132, 134 or the pads of vaporizable material 128, 130, 406, 408.

The third embodiment resonator 500 includes first and second traces 502, 504 that extend from between the first and second insulator layers 110, 112 across the oblong opening formed in the insulator layers 110, 112, over the first and second ends 114B, 114C respectively of the main beam. The first and second traces 502, 504 preferably comprise a material that is capable of sublimation, more preferably the first and second traces 502, 504 comprise Titanium. A term of art that may be aptly used to describe the portions of the first and second traces 502, 504 that extend through the oblong opening is 'air bridge'.

A current from an electrical power source (not shown) that is sufficient to cause the first and second traces 502, 504 to sublimate is passed through the first and second traces 502, 504 causing them to sublimate. Some of the material sublimated from the traces 502, 504 will deposit of the main beam 114 thereby lowering the resonant frequency of the resonator 500.

In as much as the first and second traces 502, 504 pass in close proximity to the main beam 114, they may also be used to drive or sense the vibration of the main beam 114.

Figure 8:
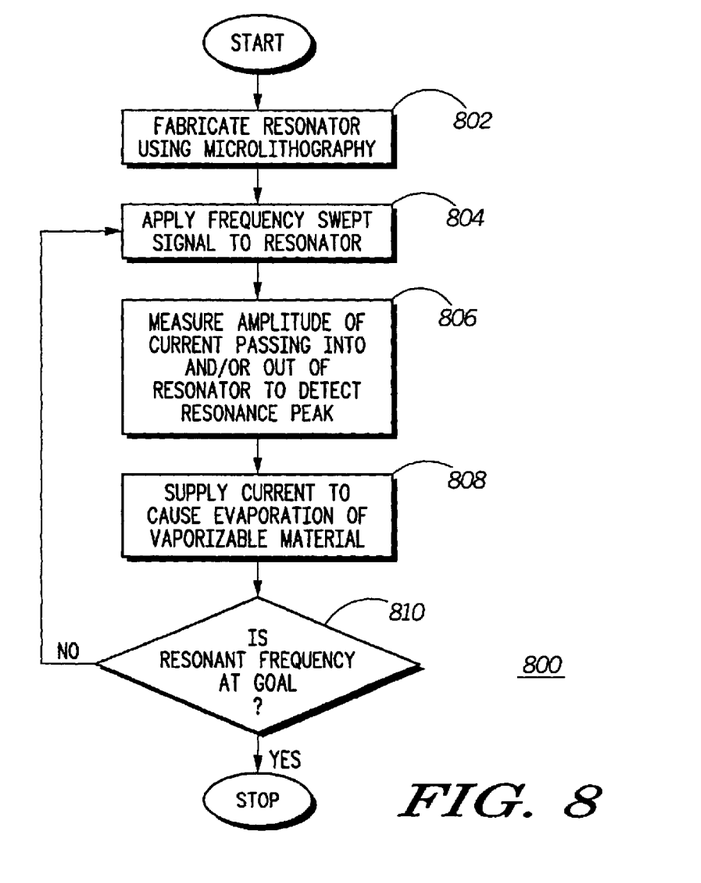
FIG. 8 is a flow diagram of a method for fabricating and tuning a MEMS resonator (e.g., first, second or third embodiment).

FIG. 8 is a flow diagram of a method 800 for fabricating and tuning a MEMS resonator. Referring to FIG. 8 in step 802 a resonator (e.g., first, second or third embodiment) is fabricated using microlithography techniques. An elaboration on step 802 that is suitable for fabricating the resonators shown in FIG. 1 and FIG. 4, is presented in FIGS. 9–10 and discussed below.

In the case of the first and third resonators 100, 500 the following three steps, 804, 806, 808 are preferably performed concurrently. In the case of the second resonator 500, step 804 and 806 are performed concurrently, and step 880 performed thereafter.

In step 804 a frequency swept signal is applied to the resonator in order to drive the resonator into vibration or oscillation. In the case of the first and third resonators 100, 500 drive signals may be applied to the first conductive pathway 120 or to the second conductive pathway 124 or oppositely phased signals may be applied to both the first and second conductive pathways 120, 124 In the case of the third resonator 500, drive signals may alternatively be applied to first and second traces 502, 504. In the case of the third resonator 500, a drive signal may be applied to either the first trace 502, or to the second trace 504 or oppositely phased signals may be applied to both the first and second traces 502, 504. In the case of the second resonator a drive signal may be applied to either the third of fourth conductive pathways 402, 404 or oppositely phased drive signals may be applied to both the third and fourth conductive pathways.

In step 806 the amplitude of a current passing into or out of the resonator is measured to detect a resonance peak. In the case of the first and third resonators 100, 500 current(s) passing through the first and/or second conductive pathways 120, 124 may be measured. Alternatively, in the case of the third resonator 500 current(s) passing through one or both of the first and traces 502, 504 may be measured. In the case of the second resonator 400 current passing through the fifth or sixth conductive pathways 402, 404 may be measured.

In step 808 current is supplied to cause evaporation of the vaporizable material 128, 130 (FIG. 1), 406, 408 (FIG. 4), 502, 504 (FIG. 5). Current is preferably supplied to an ohmic heating means. In the case of the first resonator 100 current is supplied to the third and fourth conductive pathways 132, 134. In the case of the second resonator 400 current is passed from one of the fifth and sixth conductive pathways 402, 404 across the PN junction 410 to the other of the fifth and sixth conductive pathways 402, 404. Current is said to emanate from whichever of the fifth and sixth conductive pathways is P doped. In the case of the third resonator 500 current is supplied to either of both of first and second conductive traces 502, 504. In the latter case, either or both of the first and second traces 502, 504 may carry a current that includes a component used to cause sublimation, and a component used to drive the resonator 500 or to sense the oscillation/vibration of the resonator 500. The component use to ohmically is preferably at a different frequency (e.g., 0 frequency DC) from the frequency of vibration/oscillation of the resonator 500.

Step 810 is a decision block the outcome of which depends on whether a current resonant frequency of the resonator, is equal to a goal. (A discrepancy of a predetermined amount (with in design tolerance) may be allowed.) If not then the process 800 loops back to step 804 and more vaporizable material is subsequently evaporated in order to further change the resonant frequency of the resonator. If the current resonant frequency of the resonator is within the aforementioned predetermined amount of the goal, then the process 800 is terminated.

In the case of the first and third embodiments 100, 500 the mass of the resonant structure (114, 116, 118) is increased by the evaporation of the vaporizable material 128, 130, 502, 504. Therefore, the design dimensions of the first and third resonators 100, 500 are preferably set to achieve a pretuned resonant frequency that is higher than the goal resonant frequency by at least about two standard deviations of the pretuned frequency distribution that arises from manufacturing variances. Consequently it will be possible to tune most of the resonators to the goal by lowering their resonant frequency by adding mass.

On the other hand in the case of the second embodiment 400 the mass of the resonant structure (114, 116, 118) is decreased by the evaporation of vaporizable material 406, 408. The design dimensions of the second resonator are preferably set to achieve a pretuned resonant frequency that is lower than the goal resonant frequency by at least about two standard deviations of the pretuned frequency distribution that arises from manufacturing variances. As a consequence, it will be possible to tune most of the second embodiment type resonators by reducing mass and increasing their resonant frequency.

Figure 9:
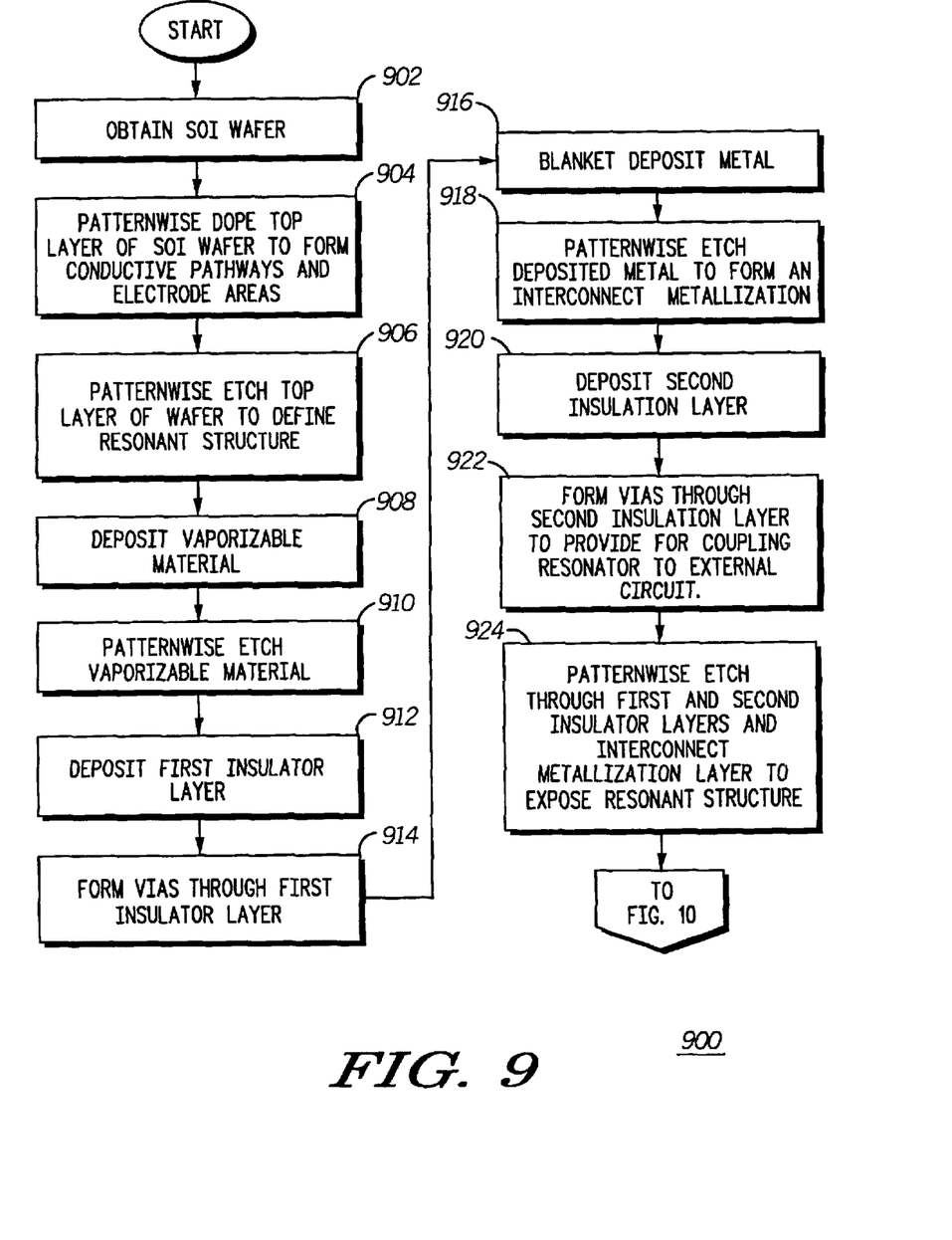
FIG. 9 is a flow diagram of a first part of a method for fabricating a MEMS resonator used in the method shown in FIG. 8 according to an embodiment of the invention.
Figure 10:
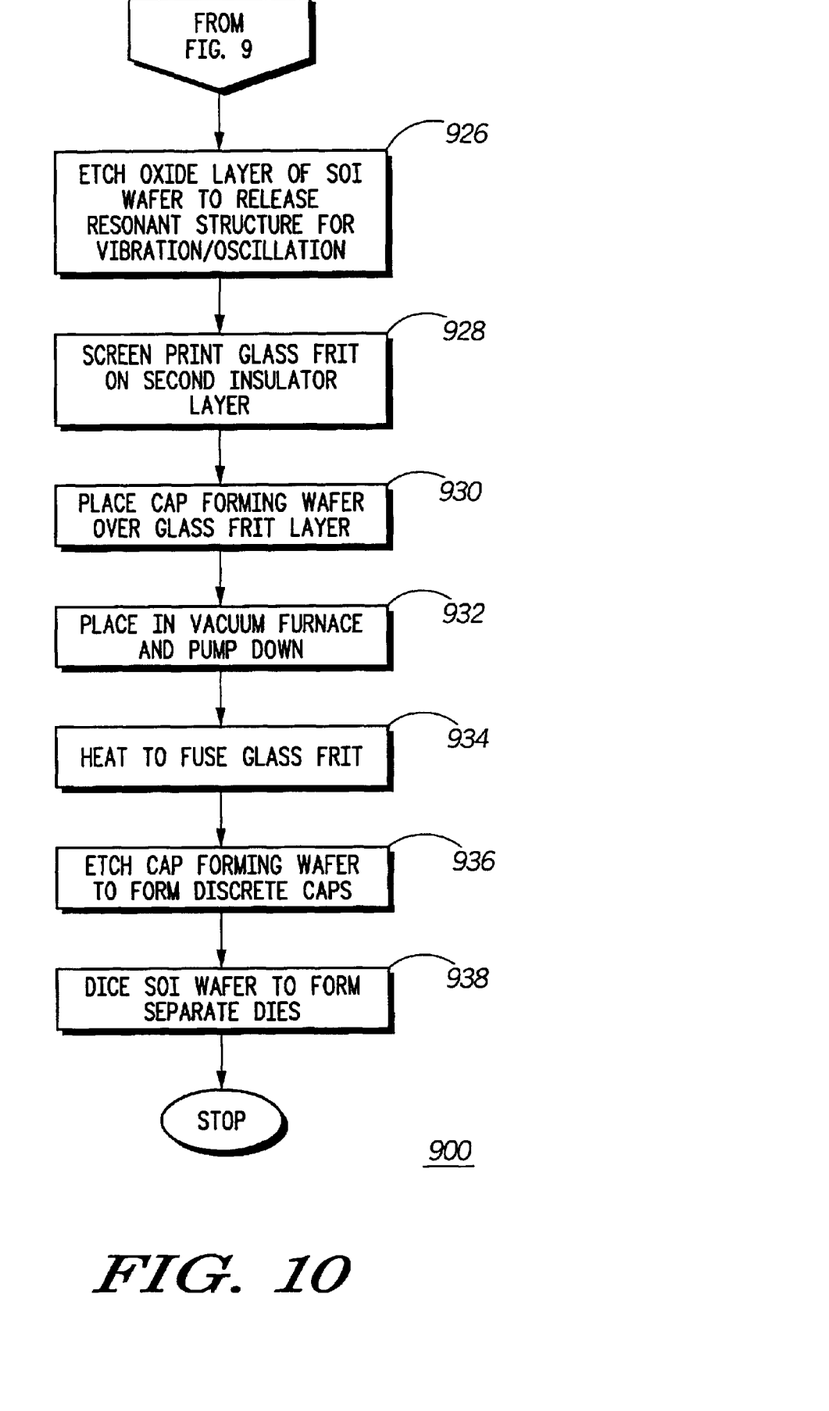
FIG. 10 is a continuation of the flow diagram begun in FIG. 9.

FIG. 9 is a flow diagram of a first part of a method for fabricating a MEMS resonator used in the method shown in FIG. 8 according to an embodiment of the invention and FIG. 10 is a continuation of the flow diagram begun in FIG. 9. The method shown in FIGS. 9 and 10 is applicable to fabricating the resonators shown in FIGS. 1 and 4.

Referring to FIG. 9, in step 902 a SOI wafer is obtained. SOI wafers can be produced using a number of manufacturing processes including the UNIBOND™ process, the Separation by Implantation with Oxygen (SIMOX), and the Bond and Etch Back Silicon on Insulator (BESOI) process. SOI wafers are available commercially. In carrying out the invention SOI wafers would likely be obtained commercially and not produced in-house. UNIBOND™ SOI wafers are available commercially from SOITEC USA of Peabody, Mass. SIMOX SOI wafers are available from IBIS corporation of Danvers, Mass. Wafers made according to a process that is a variant of the BESOI process are available commercially from Cannon U.S.A., Inc of Lake Success, N.Y.

In step 904 the top (preferably silicon) layer 108 of the SOI wafer obtained in step 902 is patternwise doped to form the various conductive pathways 120, 124 132, 134 (FIG. 1) or 402, 404 (FIG. 4) and electrodes 122, 126 (FIG. 1). Step 904 may include multiple sub steps, e.g., multiple ion implant steps.

In step 906 the top layer 108 of the SOI wafer is patternwise etched to define the resonant structure e.g., the main beam 114 and support beams 116, 118.

In step 908 a blanket layer of the vaporizable material is deposited over the top layer 108 of the SOI wafer, and in step 910 the layer of vaporizable material is patternwise etched to form pads of vaporizable material 128, 130 (FIG. 1) or 406, 408 (FIG. 4). Alternatively, in lieu of steps 908 and 910 a lift-off process may be used to deposit the pads of vaporizable material 128, 130 (FIG. 1), 406, 408 (FIG. 4).

In step 912 the first insulator layer 110 is deposited and step 914 vias (including 306, 308, FIG. 3) are formed through the first insulator layer 110 to couple to the doped conductive pathways 120, 124, 132, 134 (FIG. 1) or 402, 404 (FIG. 4) in the top layer 108.

In step 916 a layer of conductive metal is blanket deposited over the first insulator layer 110, and in step 918 the layer of conductive metal is patternwise etched to form a metal interconnection network layer. In the case of the embodiment shown in FIG. 1, the metal interconnection layer includes the first and second conductive traces 136, 302. More than one metal interconnection network layer may be provided if very complex circuits are to be fabricated on the die 102.

In step 920 the second insulator layer 112 is deposited over the metal interconnection network layer and in step 922 vias (not shown) are formed through the second insulation layer 112 for the purpose of connecting the resonator 100 (FIG. 1) or 400 (FIG. 4) to an external circuit (not shown).

In step 924 another patternwise etching step is performed. The latter etching step etches through the second insulator layer 112, past the interconnect network layer, through the first insulator layer 110, and exposes the resonant structure 114, 116, 118 of the resonator.

Referring now to FIG. 10 in step 926, the oxide layer 106 of the of the SOI wafer is etched with an isotropic etch (e.g., a buffered oxide etch) in order to free the resonant structure 114, 116, 118 for vibration and/or oscillatory movement.

In step 928 the glass frit material 204 is screen printed on the second insulator layer 112, and in step 930 a cap forming wafer is laid over the glass frit material 204.

In step 930 the assembly assembled in step 928 is placed into a vacuum furnace which is then substantially evacuated. In step 934 the assembly is heated to fuse the glass frit forming a vacuum tight seal.

In step 926 the cap forming wafer is etched through to form discrete caps 202 (FIGS. 2, 3, 6, 7). The caps 202 cover only a portion of each die area of the SOI wafer, so that electrical contacts (not shown) at the surface of the second insulator layer may be accessed for coupling to an external circuit (not shown).

Additional steps (not shown) for forming bonding pads that are known to a person having ordinary skill in the microchip fabrication arts may be used.

In step 938 the SOI wafer with affixed caps 202 is diced to form discrete dies 102.

In order to fabricated the third embodiment resonator shown in FIGS. 5–7 the process shown in FIGS. 9–10 may be modified as follows. The first and second pathways 502, 504 would be defined by the etching step used to form the interconnect metallization, which in this case would comprise a vaporizable material (e.g., titanium). Steps 908, and 910 may then be eliminated.

The invention allows individual resonators to be tuned electrically after vacuum packaging. Thus the need for complex external equipment to affect tuning is obviated.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. A microelectromechanical resonator comprising:
   a microelectromechanical resonant structure characterized by a mass and one or more selectively doped regions;
   a vaporizable material for altering the mass of the resonant structure.

2. The microelectromechanical resonator according to claim 1, wherein the vaporizable material is initially borne on the resonant structure.

3. The microelectromechanical resonator according to claim 2 wherein: the resonant structure comprises:
   a semiconductor structure including: the one or more selectively doped regions for establishing electric forces for driving a vibration mode of the semiconductor structure.

4. The microelectromechanical resonator according to claim 1 further comprising:
   a vacuum enclosure surrounding the resonant structure and the vaporizable material.

5. The microelectromechanical resonator according to claim 4 wherein:
   the vaporizable material comprises Titanium.

6. The microelectromechanical resonator according to claim 1 wherein:
   the resonant structure comprises:
   a main beam; and
   one or more torsional hinges supporting the main beam.

7. A microelectromechanical resonator comprising:
   a microelectromechanical resonant structure characterized by a mass;
   a vaporizable material for altering the mass of the resonant structure, the vaporizable material being initially located proximate to the resonant structure, and the vaporizable material comprising an air bridge that extends over the resonant structure.

8. The microelectromechanical resonator according to claim 7 wherein:
   the vaporizable material is electrically conductive and is adapted for coupling to an electrical power source of sufficient power to cause the vaporizable material to vaporize.

9. The microelectromechanical resonator according to claim 8 wherein:
   the vaporizable material comprises Titanium.

10. The microelectromechanical resonator according to claim 9 further comprising:
    a vacuum enclosure surrounding the resonant structure and the vaporizable material.

11. The microelectromechanical resonator according to claim 10 wherein the vacuum enclosure comprises:
    a lid affixed over a recess in which the resonant structure and the vaporizable material are located.

12. A microelectromechanical resonator comprising:
    a microelectromechanical resonant structure characterized by a mass, the resonant structure comprising a main beam and one or more torsional hinges supporting the main beam;
    a vaporizable material for altering the mass of the resonant structure;
    the microelectromechanical resonator further comprising:
    a base;
    an oxide layer overlying the base, wherein the oxide layer includes:
       an inner edge defining an opening in the oxide layer;
       a semiconductor layer overlying the oxide layer, wherein the semiconductor layer includes:
          the main beam; and
          the one or more torsional hinges supporting the main beam; and
       the main beam and the one or more torsional hinges overlie the opening in the oxide layer.

13. The microelectromechanical resonator according to claim 12 wherein:
    the vaporizable material includes a first patch that is located on the main beam.

14. The microelectromechanical resonator according to claim 12 wherein
    the main beam includes:
    a first end;
    a second end; and
    a longitudinal center;

the first patch is located proximate the first end of the main beam;

the vaporizable material further comprises a second patch that is located proximate the second end of the main beam;

the one or more torsional hinges include a first torsional hinge and a second torsional hinge; and the resonator further comprises;

a first conductive pathway of a first dopant type that extends over the first torsional hinge, to the main beam, under the first patch and to the longitudinal center of the main beam; and a second conductive pathway of a second dopant type, that extends over the second torsional hinge, under the second patch, and to the longitudinal center of the main beam, forming a PN junction with the first conductive pathway at the longitudinal center of the main beam.

15. The microelectromechanical resonator according to claim 12 wherein the semiconductor layer includes a peripheral portion that is peripheral to the main beam and torsional hinges; and the vaporizable material includes a patch that is located on the peripheral portion.

16. The microelectromechanical resonator according to claim 15 further comprising:

a doped conductive pathway that includes:
a narrow segment proximate to the patch for ohmically heating the patch to cause the patch to sublimate.

17. The microelectromechanical resonator according to claim 16 wherein: the vaporizable material comprises Titanium.

18. The microelectromechanical resonator according to claim 12 further comprising:

one or more additional layers overlying the semiconductor layer; and one or more inner peripheral edges of the one more additional defining an opening through the one or more additional layers surrounding main beam and torsional hinges; and a cap over the opening.

19. The microelectromechanical resonator according to claim 18 wherein:

the one or more additional layers includes:
a first layer; and
a second layer overlying the first layer; and
the resonator comprises:
an air bridge that extends from between the first layer and the second layer across the opening, wherein the air bridge includes the vaporizable material.

* * * * *